United States Patent [19]
Schultz et al.

[11] Patent Number: 4,735,856
[45] Date of Patent: Apr. 5, 1988

[54] HERMETIC COATINGS FOR OPTICAL FIBER AND PRODUCT

[75] Inventors: Peter C. Schultz; Satyabrata Raychaudhuri, both of Sturbridge, Mass.

[73] Assignee: SpecTran Corporation, Sturbridge, Mass.

[21] Appl. No.: 846,331

[22] Filed: Mar. 31, 1986

[51] Int. Cl.$^4$ .................... B32B 9/00; D02G 3/00
[52] U.S. Cl. .................... 428/366; 350/96.29; 350/96.3; 427/163; 427/249; 427/255; 427/255.2; 427/255.7; 427/419.2; 427/419.7; 428/368; 428/375; 428/379; 428/384; 428/389
[58] Field of Search ............ 427/249, 255, 163, 255.7, 427/419.2, 419.7, 434.6, 255.2; 428/366, 368, 375, 384, 379, 389; 350/96.23, 9, 96.29, 96.30, 96.34, 96.33

[56] References Cited

U.S. PATENT DOCUMENTS

| | | | |
|---|---|---|---|
| 2,764,510 | 9/1956 | Ziegler | 427/249 |
| 3,398,013 | 8/1968 | Krochmal et al. | 427/249 |
| 3,428,519 | 2/1969 | Zvanut | 427/249 |
| 3,811,920 | 5/1974 | Galasso et al. | 427/249 |
| 3,904,505 | 9/1975 | Aisenberg | 204/298 |
| 3,961,103 | 6/1976 | Aisenberg | 427/39 |
| 4,028,080 | 6/1977 | DiVita et al. | 65/2 |
| 4,118,211 | 10/1978 | AuCoin et al. | 65/3 R |
| 4,183,621 | 1/1980 | Kao et al. | 350/96.30 |
| 4,287,259 | 9/1981 | Riley e al. | 427/249 |
| 4,312,911 | 1/1982 | Smith et al. | 428/701 |
| 4,379,111 | 4/1983 | Smith et al. | 428/392 |
| 4,402,993 | 9/1983 | Aisenberg et al. | 427/38 |
| 4,418,984 | 12/1983 | Wysocki et al. | 427/163 |
| 4,448,484 | 5/1984 | Lombardi et al. | 350/96.23 |
| 4,469,724 | 9/1984 | Klinger | 427/54.1 |
| 4,473,599 | 9/1984 | Elion | 427/164 |
| 4,487,474 | 12/1984 | Nishie et al. | 350/96.21 |
| 4,512,629 | 4/1985 | Hanson et al. | 350/96.30 |
| 4,525,026 | 6/1985 | Elion | 350/96.23 |
| 4,540,601 | 9/1985 | Nath | 427/163 |

OTHER PUBLICATIONS

Pinnow et al., "Reduction in Static Fatigue of Silica Fibers by Hermetic Jacketing," Appl. Phys. Lett. 34(1), Jan. 79.

Stein et al., "Ion Plasma Deposition of Hermetic Coatings for Optical Fibers," Proc. of CLEO, Washington, D.C., Jun. 10–12, 1981.

Stevens et al., "Carbon–Coated Optical Fibers," Proc. of DARPA Workshop, Alburquerque, NM, Apr. 19–20, 1982.

*Primary Examiner*—Sadie L. Childs
*Attorney, Agent, or Firm*—Pennie & Edmonds

[57] ABSTRACT

A method for hermetically sealing a silica based fiber product after the fiber product has been drawn from a melt or preform wherein a hermetic layer of boron carbide or a ceramic compound having a density of above about 4 g/cc is deposited upon the fiber product. The fiber product can be initially coated with carbon or boron carbide prior to the application of the ceramic compound. Also, a method for making such fiber products using these methods, and the resultant hermetically sealed fiber products produced thereby.

29 Claims, 5 Drawing Sheets

Microbend Test Procedure

HERMETIC COATINGS FOR OPTICAL FIBER AND PRODUCT

TECHNICAL FIELD

The invention relates to methods for providing various hermetic coatings on silica-based fiber products and to the coated fiber products produced by such methods.

BACKGROUND ART

Mechanical failure of optical fibers under stress over extended periods of use is a phenomenon known as static fatigue. It is well known that bare uncoated fibers are susceptible to abrasion which results in surface scratches. These scratches can produce a significant loss of light through the sides of the fiber and can also result in sudden failure through breakage of the fiber. Optical fibers are susceptible to breakage not only because they are formed from relatively brittle materials, but in addition, the fibers typically have very small diameters and are subjected to an assortment of stresses such as bending stresses, tensile stresses, and the like.

Optical fibers are also susceptible to stress corrosion cracking. Water or hydroxyl ions can react with a fiber under stress, thus damaging its optical properties and weakening its mechanical strength and static fatigue resistance. Microcracks in fiber surfaces present regions which are susceptible to attack by hydroxyl ions or moisture when the fiber is under stress. Such stress tends to open these cracks thereby straining the chemical bonds at the tips of the cracks. These strained bonds are readily attacked by moisture enabling the phenomenon called stress corrosion cracking to proceed and propagate such microcracks. Growth of these microcracks weakens the fiber continuously over a period of time until it produces sudden failure. As mentioned above, this problem is termed static fatigue.

One solution to the problem of static fatigue is to put an impervious hermetic coating around the fiber, so that the atmospheric moisture cannot reach the fiber surface. Various types of coatings have been investigated. A metallic seal of aluminum has been suggested as a hermetic coating ("Reduction in static fatigue of silica fibers by hermetic jacketing"—Pinnow, Robertson, Wysoski—Appl. Phys. Lett. 34(1), January 1979), however, metals tend to form polycrystalline solids which can themselves be corroded by moisture or by enhanced grain boundary diffusion. Metal coatings also provide undesirable electrical paths along the fiber.

Several non-metallic coatings have also been utilized. For example, silicon nitride (U.S. Pat. No. 4,028,080 to DiVita et al) has been investigated as a potential coating, but silicon nitride has been seen to weaken the fiber substantially due to residual stress in the coating. Also, it is difficult to make strong fibers in long lengths with silicon nitride. Pyrolytic carbon has also been suggested in U.S. Pat. No. 4,183,621 to Kao et al and sputter deposited carbon was suggested by Stein et al ("Ion plasma deposition of carbon-indium hermetic coatings for optical fibers"—Proceedings of Conference of Laser and Electro-Optics, Washington, D.C., June 10–12, 1982). But in both cases, the crack velocity exponent N of the coating were determined to be in the range of 23–30. This means that such coatings are really not hermetic. It has recently been reported that silicon carbide is a good hermetic coating (U.S. Pat. No. 4,512,629 to Hanson et al). The results of investigation with silicon carbide indicate a N value of 100 or higher can be obtained with good median strength.

SUMMARY OF THE INVENTION

One aspect of the invention relates to a method for hermetically sealing silica based fiber products which have been drawn from a melt or preform, which comprises coating the products with a hermetic layer of at least one ceramic compound having a density above 4 g/cc. Typical silica based fiber products include optical fiber or capillary tubes. The ceramic compound can be a transition metal carbide, nitride, oxide, boride, or mixtures thereof. Two or more of these compounds can be codeposited, or two or more layers of different ceramic compounds can be deposited.

Preferred ceramic compounds include carbides such as titanium carbide or chromium carbide, nitrides such as tungsten carbide, titanium nitride or chromium nitride, refractory metal oxides such as tungsten oxide, chromium oxide, or borides such as tungsten boride, titanium boride or chromium boride. Boron carbide has also been found useful in this invention despite that it has a density of only 2.5 g/cc. A preferred technique for coating the product with any of these compounds is by chemical vapor deposition.

An alternate embodiment for hermetically sealing such products includes an additional step of initially coating the fiber products with a layer of carbon or boron carbide prior to depositing thereupon a ceramic material of a carbide, nitride, oxide or boride. When compounds such as silicon carbide, silicon oxynitride, boron nitride, or the compounds mentioned above are deposited over an initial carbon layer, it was found that the carbon layer provides increased strength to the overall coated product. Since boron carbide has a similar density to that of carbon, it is believed that similar advantages would be provided when boron carbide is used as the initial layer.

The invention also relates to methods for making such hermetically sealed silica based fiber products, as well as to the sealed products produced thereby.

BRIEF DESCRIPTION OF THE DRAWINGS

The nature, advantages, and various other additional features of the invention will appear more fully upon consideration of the illustrative embodiments now to be described in detail in connection with the accompanying drawing figures, wherein.

DETAILED DESCRIPTION OF THE INVENTION

In the description that follows, the term silica based fiber product is used to denote elongated members comprised primarily of silica. This would include optical fibers of silica or other glasses, as well as silica capillary tubes. In describing the preferred embodiments, reference will be made to optical fiber for convenience, although the methods of the invention are useful for coating other fiber products.

Furthermore, the basic coating operation utilizing a chemical vapor deposition process is well known in the art and all coatings described in this invention can be deposited by this process. While it is advantageous to use the chemical vapor deposition process, the invention is operable with a number of other processes, including sputtering, vacuum deposition, or the like.

Before depositing any coating on optical fiber, one has to go through the sequence of operations for a regular draw of fiber from a melt or an optical preform. This technique is well known in the art. Once the fiber draw process has been stabilized at the necessary draw speed, the process of coating the fiber with the ceramic compounds of the invention can be initiated.

Figure 1:
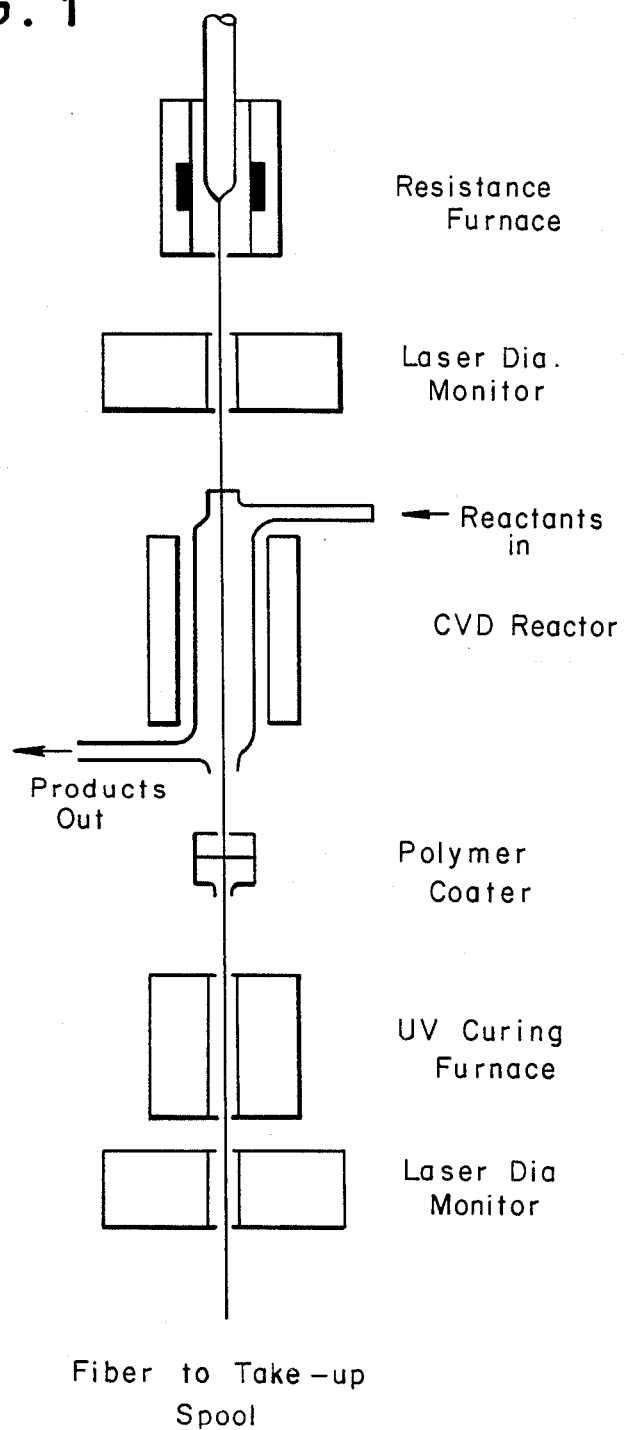
FIG. 1 is a schematic of the equipment needed to carry out one method of the invention.

FIG. 1 is a schematic diagram of the experimental arrangement used for coating optical fiber with titanium carbide. A chemical vapor deposition (CVD) reactor, in the form of a quartz tube placed inside a furnace with temperature control, is used to deposit a titanium carbide coating.

The first step in this process is to raise the temperature of the furnace to the reaction temperature—which is about 1000°–1100° C.—under a small nitrogen purge. The fiber is passed through the reactor and, once the desired temperature is achieved, nitrogen is passed through a bubbler containing 99.9% titanium tetrachloride. The bubbler is kept inside an oil bath maintained at 60° C. Nitrogen containing $TiCl_4$ vapors enter the reactor. Hydrogen is next introduced inside the reactor, followed by gaseous n-butane. The flowrates of different components appear below. Diluent nitrogen is also added to the reactant stream.

The experimental conditions are as follows:

| | |
|---|---|
| Temperature of reactor = | 1000–1100° C. |
| Flow rates: | |
| $N_2$ thru $TiCl_4$ bubbler = | 100–500 cc/min |
| $H_2$ = | 300–1000 cc/min |
| N—butane = | 50–100 cc/min |
| diluent $N_2$ = | 300–1000 cc/min |
| Reactor Pressure = | −0.02 to −0.03 inch $H_2O$ |
| Fiber Draw Speed = | 20 m/min |

There is one injection point of reactants to the CVD reactor. Consequently, all the reactant gases are mixed in one line before entering the reactor. This assures homogeneity of the reaction mixture. The reactor is maintained under slightly negative pressure, so that all the particulates formed inside the reactor are continuously removed. The reaction products are then passed through a water scrubber before being vented to the atmosphere.

After coating the fiber with a layer of titanium carbide, a UV cured acrylate coating may be applied online using conventional methods to provide protection during routine handling.

It is also possible to provide an initial layer of carbon beneath this titanium carbide layer to provide strength enhancement for the coated fiber. In addition, it has been found that this initial carbon layer provides strength improvement for a variety of ceramic outer layers, including nitrides or carbides, for example, silicon oxynitride, silicon carbide, tungsten carbide, boron nitride and the like. For the purpose of illustrating the invention, an outer layer of titanium carbide over the initial carbon layer will be described hereinbelow.

Figure 2:
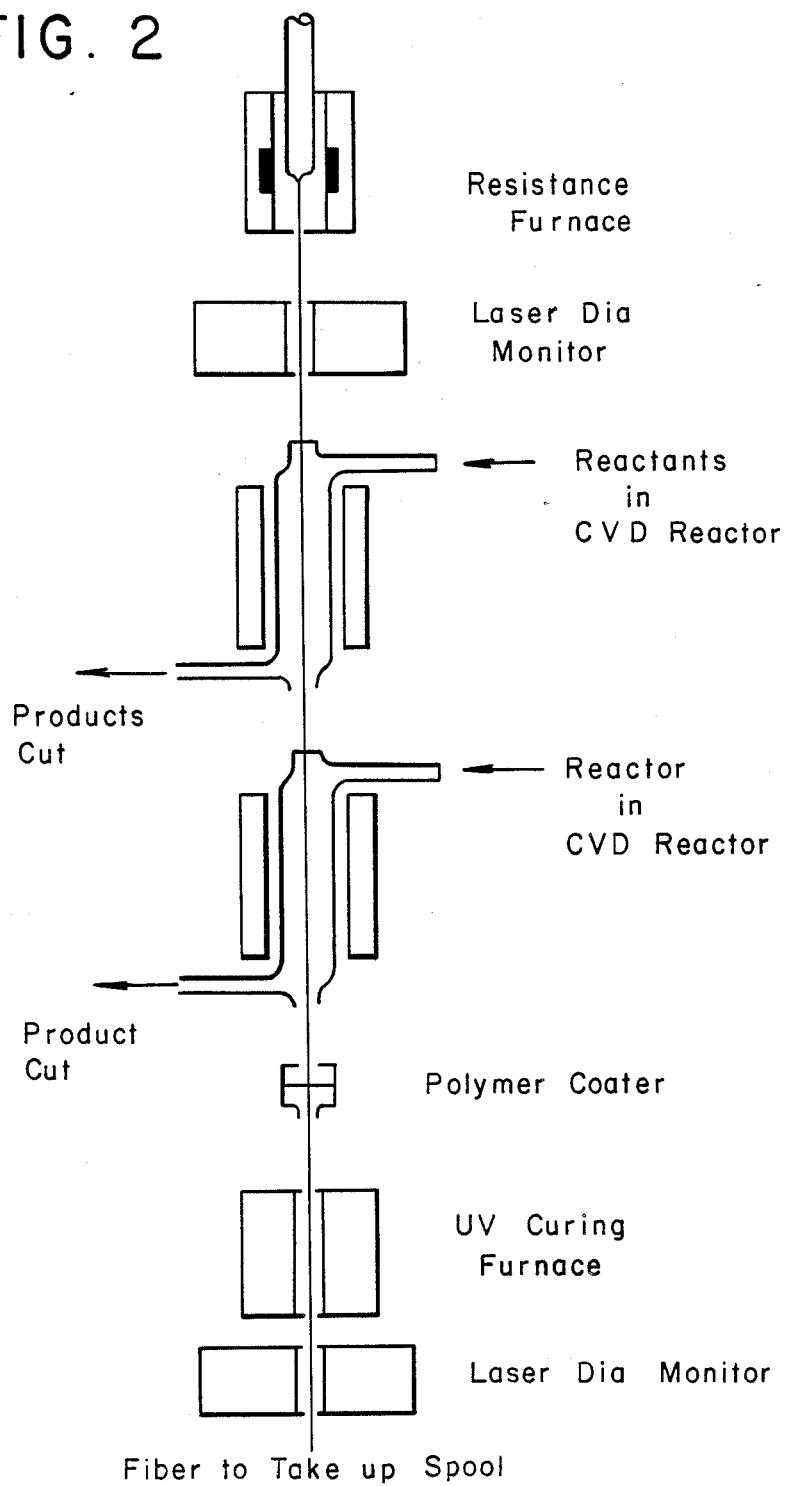
FIG. 2 is a schematic of the equipment needed to carry out multiple layer deposition according to the invention.

When coating the fiber with a composite of carbon and a ceramic compound, the same experimental set-up is used, except that two CVD reactors are placed in series. This arrangement is illustrated in FIG. 2. The fiber is coated with a thin carbon layer in the top CVD reactor by cracking butane at a temperature of 1100° C.

The carbon coated fiber then enters the bottom reactor where a layer of titanium carbide is deposited upon the carbon layer under same conditions described above. The initial carbon layer or undercoat substantially improves the strength of the fiber, as shown in Table I. Both reactors are maintained at slightly negative pressures so that particulates can be continuously removed from the system.

The experimental conditions for depositing the dual layer carbon/ceramic coating is as follows:

Top CVD Reactor (carbon coating):

| | |
|---|---|
| Temperature of reactor = | 1100° C. |
| Flow rate n-butane = | 50–100 cc/min |
| Reactor Pressure = | −0.02 to −0.03 inch $H_2O$ |

Bottom CVD Reactor (titanium carbide coating):

| | |
|---|---|
| Temperature of reactor = | 1000–1100° C. |
| Flow rates: | |
| $N_2$ thru $TiCl_4$ bubbler = | 100–500 cc/min |
| $H_2$ = | 300–1000 cc/min |
| N—butane = | 50–100 cc/min |
| diluent $N_2$ = | 300–1000 cc/min |
| Reactor Pressure = | −0.02 to −0.03 inch $H_2O$ |
| Fiber Draw Speed = | 20 m/min |

After coating the fiber with the ceramic layer (i.e., titanium carbide), a UV cured acrylate coating may also be applied for protection of the coated fiber during handling.

Figure 3:
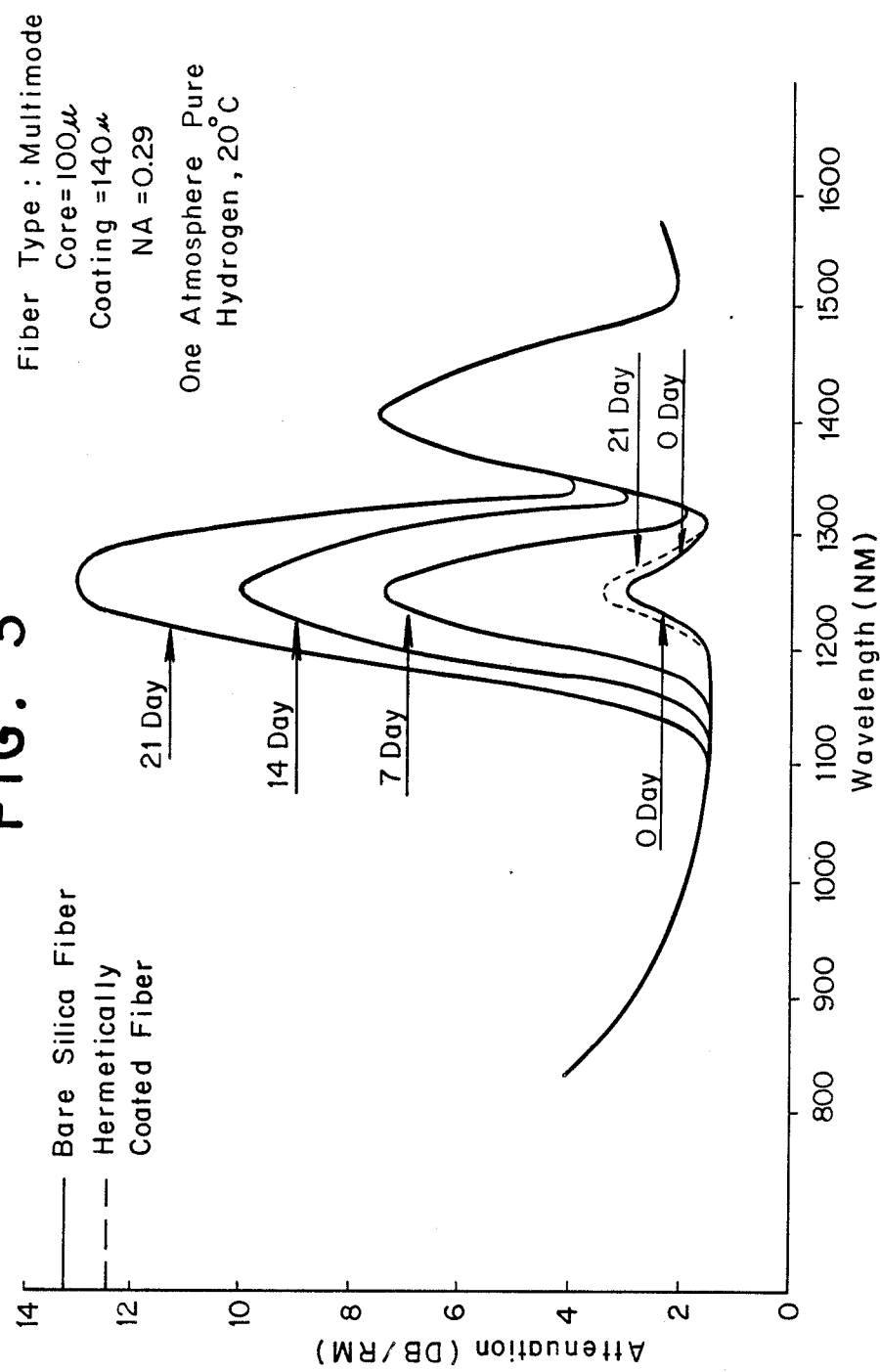
FIG. 3 is a graphical illustration of the optical aging characteristics in hydrogen for the coated fiber products of the invention compared to the uncoated fiber products of prior art.

The properties of the coated fibers of the invention are shown in Table I and were determined by the inventors in the laboratory experiments. The hydrogen aging resistance for the titanium carbide coated fiber is shown in FIG. 3.

TABLE I
PROPERTIES OF COATED FIBER

| Coating Material | Coating Thickness | $DFT^1$ Strength | N Value by DFT | $H_2$ Diffusion Data | Draw Speed |
|---|---|---|---|---|---|
| $SiON^2$ | 500 A | 200–250 ksi | 90 | 90% resistance | 10 m/min |
| C—SiON | 500 A | 300–450 ksi | 70 | 90% resistance (estimated) | 10 m/min |
| $SiC^2$ | 500 A | 500 ksi | 90–95 | — | 10 m/min |
| $C^2$ | 200–250 A | 650 ksi | 23 | 30% resistance (double coat) | 10 m/min |
| C—TiC | 200–250 A | 500–600 ksi | 90 | 90% resistance | 10 m/min |
| TiC | 200–250 A | 400–500 ksi | 90–100 | 90% resistance | 30 m/min |
| control | uncoated | 600–650 | 23 | — | 30 m/min |

TABLE I-continued
PROPERTIES OF COATED FIBER

| Coating Material | Coating Thickness | DFT[1] Strength ksi | N Value by DFT | H$_2$ Diffusion Data | Draw Speed |
|---|---|---|---|---|---|

Notes:
[1] DFT means dynamic fatigue strength measured on an Instron tester using 0.5 m gauge length fiber.
[2] Prior art coatings, not according to the invention.

The hydrogen diffusion data were determine by placing the fiber in a chamber containing one atmosphere of hydrogen at 20° C. and monitoring the optical losses of the fiber over time. The term "percent resistance" refers to the optical loss change at 1250 Nm for the hermetically coated fiber of the invention compared to uncoated fiber.

Figure 4:
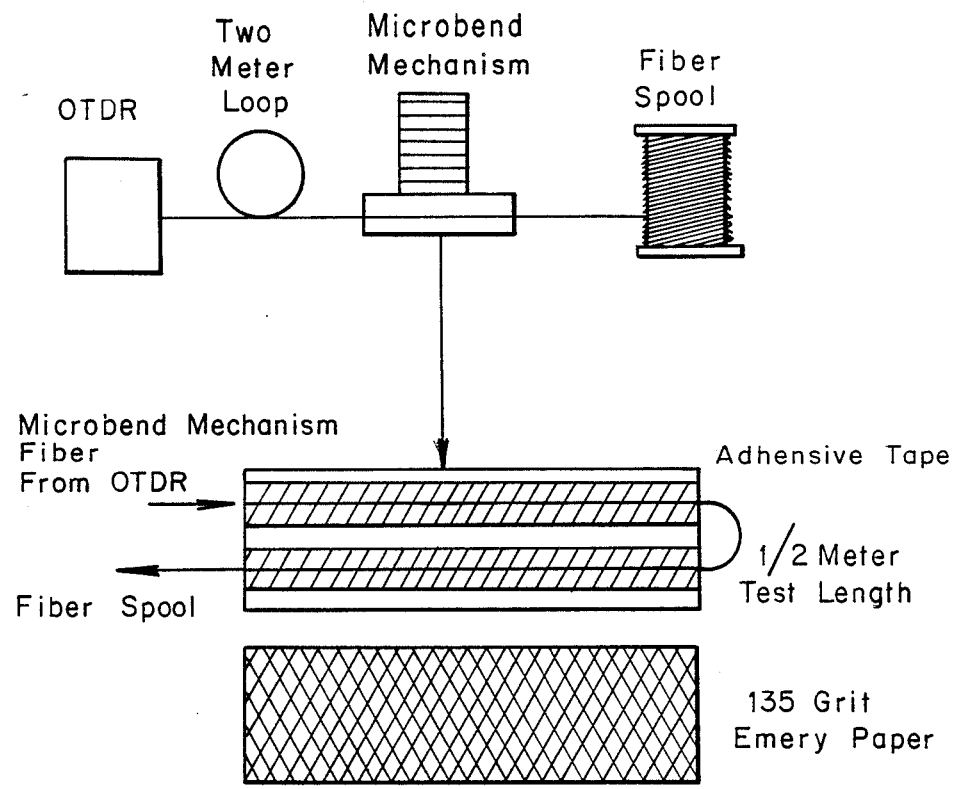
FIG. 4 is a schematic of the test equipment needed to perform microbend tests.

The values were developed using the microbend equipment illustrated in FIG. 4. Fiber from the drawing apparatus is directed around a two meter loop before passing through the microbend apparatus and thereafter, onto the fiber spools. The microbend test procedure is as follows:

1. measure attenuation of the fiber prior to microbending.
2. insert the fiber into the microbend device, and then close the device.
3. add a 1 kg weight to the device.
4. measure the attenuation of the fiber.
5. repeat steps 3 and 4 until attenuation data for a total of 10 kg has been obtained.

Figure 5:
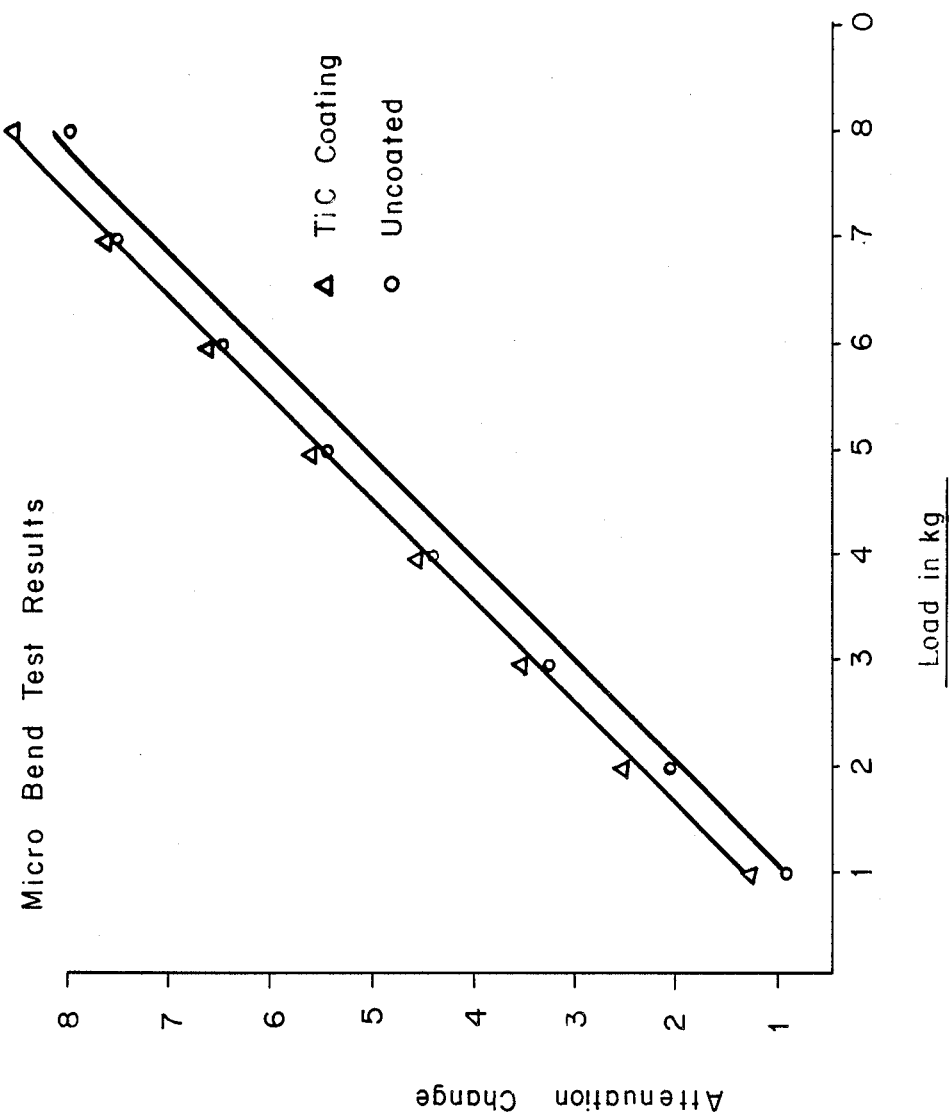
FIG. 5 is a graphical illustration of the microbend test results for fiber products coated according to the invention compared to the uncoated fiber products of the prior art.

The induced attenuation is the difference between the attenuation measured under the load compared to the attenuation of the fiber with no load. This value is plotted against cumulative load, and results are shown in FIG. 5.

In lieu of fused silica as the optical fiber, it is possible to use other silica based glasses, such as borosilicate glass, alkali-lead silicate glass, or fused silica that has been doped with index altering elements, such as titanium, germanium, phosphorus, boron or fluorine. In lieu of the chemical vapor deposition method, one might use other coating techniques such, as vacuum deposition, sputtering, ion-beam or RF or DC plasma. Although the figures illustrate the use of one or two CVD reactors, it is to be understood that the appropriate number of CVD reactors can be used in series for depositing the desired number of coating layers.

It is believed that the improved moisture resistance of the sealed fiber products results from the use of the high density ceramic compounds. Such high densities (i.e., above 4 g/cc) appear to act as very effective barriers to moisture and hydrogen diffusion, thus preventing moisture from contacting the tip of the crack. Such compounds also prevent hydrogen from penetrating the fiber core thereby increasing attenuation. The densities of certain ceramic compounds are shown below in the Table II.

TABLE II
Ceramic Compound Densities

| Compound | Density (g/cc) |
|---|---|
| titanium carbide (TiC) | 4.9 |
| titanium boride (TiB$_2$) | 4.5 |
| titanium nitride (TiN) | 5.2 |
| titanium oxide (TiO$_2$ anatase) | 3.8 |
| chromium carbide (Cr$_3$C$_2$) | 6.7 |
| chromium nitride (CrN) | 5.9 |
| chromium boride (CrB) | 6.2 |
| chromium oxide (Cr$_2$O$_3$) | 5.2 |
| tungsten carbide (WC) | 15.6 |
| tungsten nitride (WN$_2$) | >10 (estimated) |
| tungsten oxide (WO$_2$) | 12.1 |
| tungsten boride (WB$_2$) | 10.8 |
| silicon nitride (SiN) | 3.2 |
| silicon carbide (SiC) | 3.2 |
| boron carbide (B$_4$C) | 2.5 |
| graphite (C) | 2.2 |

Titanium oxide, silicon nitride, silicon carbide and graphite are shown as reference compounds because their densities are below 4 g/cc. Although the density of boron carbide does not fall within the preferred range of greater than 4 g/cc, it has nevertheless been found to be effective in these coating applications, whether deposited alone or upon an initial carbon layer. Also, it is believed that boron carbide can be substituted for carbon as the initial layer before depositing other ceramic compounds thereupon with similar improvements in the strength of the overall coating.

According to this invention, preferred ceramic coating materials for direct deposition upon the silica based fiber products are the transition metal carbides, nitrides, borides, oxides or mixtures thereof, provided that these materials have a density of about 4 g/cc or greater. A transition metal, as is known by one skilled in the art, is defined in the CRC Handbook of Chemistry and Physics, 65th edition (1984–5) in the periodic table which appears inside the front cover, as the elements appearing in columns 3b, 4b, 5b, 6b, 7b, 8, 1b and 2b.

The thickness of the drawn optical fiber usually ranges from about 50 to 1500 microns in diameter, while the thickness of each inorganic coating can range from 100 to 1000 Angstroms. Fused quartz capillaries usually are drawn as 500 to 700 micron diameter, thick wall hollow tube. These are used in gas chromatography equipment, and by coating such capillaries, improved resistance against the high temperature, corrosive environments of such equipment is achieved. Thus, such coated capillaries provide increased resistance against breakage due to static fatigue.

The method of the invention is advantageous in that it enables the fiber to be hermetically sealed by an inorganic or ceramic coating which is not subject to oxidation or corrosion, and which is impervious to moisture, gases and chemically corrosive environments. Moreover, these coatings have a relatively low thermal coefficient of expansion which is compatible with the thermal expansion coefficient of the optical fiber. This results in hermetically sealed optical fibers having good thermal shock resistance.

The initial layer of carbon provides a substantial increase in the median strength of the fibers, even when the total coating thickness is between 100 and 1000 Angstroms. As shown in Table I, an increase in median strength by about 100 ksi can be achieved with this initial carbon layer. Similar improvement is expected with the use of boron carbide as the initial layer.

While tungsten, titanium or chromium carbides, nitrides and borides are preferred for direct deposition upon the optical fiber, the initial deposition of a carbon layer enables improved strength to be obtained when the outer layer is any one of the compounds mentioned above, or other ceramic compounds including carbides such as silicon carbide, nitrides such as boron nitride or silicon oxynitride, or various refractory metal oxides.

When the ceramic compounds of the invention are directly deposited upon the optical fiber, it is also possible to co-deposit two or more of such compounds, if desired for particular applications. Two or more of these compounds can be deposited using a single CVD reactor or, as mentioned above, the use of two or more of such reactors in series. The single CVD reactor will enable mixtures of these compounds to be deposited, while the use of a plurality of such reactors in series will enable a plurality of different ceramic layers to be deposited upon the fiber.

As mentioned above, the compounds disclosed in this invention can also be used to coat quartz capillary tubes, as well as silica based optical fibers of any cross sectional shape (i.e. round, square, triangular, rectangular, etc.).

While it is apparent that the invention herein disclosed is well calculated to fulfill the objects above stated, it will be appreciated that numerous modifications and embodiments may be devised by those skilled in the art, and it is intended that the appended claims cover all such modifications and embodiments as fall within the true spirit and scope of the present invention.

What is claimed is:

1. A method for hermetically sealing optical fiber products which comprises coating said optical fiber products with a hermetic coating of at least one ceramic compound of a transition metal carbide, nitride or boride, said compound having a density of above about 4 g/cc.

2. The method of claim 1 wherein the ceramic compound is tungsten carbide, tungsten nitride, tungsten boride, titanium carbide, titanium nitride, titanium boride, chromium carbide, chromium nitride, or chromium boride.

3. The method of claim 1 wherein said fiber products are coated with said ceramic compound by chemical vapor deposition.

4. The method of claim 1 which further comprises initially coating said fiber products with a layer of carbon or boron carbide prior to applying the layer of at least one ceramic compound.

5. The method of claim 1 wherein two or more of said ceramic compounds are codeposited as mixtures upon said fiber products.

6. The method of claim 1 wherein two or more layers of different ceramic compounds are deposited upon said fiber products.

7. A method for making a hermetically sealed optical fiber product which comprises:
drawing an optical fiber product from a melt or preform; and
coating said optical fiber product with a hermetic layer of at least one ceramic compound of a transition metal carbide, nitride, boride, or mixture thereof, said compound having a density of above about 4 g/cc as to form a hermetically sealed optical fiber product.

8. The method of claim 7 wherein the ceramic compound is tungsten carbide, tungsten nitride, tungsten boride, titanium carbide, titanium nitride, titanium boride, chromium carbide, chromium nitride, or chromium boride.

9. The method of claim 7 which further comprises initially coating said fiber product with a layer of carbon or boron carbide prior to applying the layer of at least one ceramic compound.

10. The method of claim 7 wherein two or more of said ceramic compounds are codeposited upon said fiber products.

11. The method of claim 7 wherein two or more layers of different ceramic compounds are deposited upon the initial carbon or boron carbide layer.

12. A method for hermetically sealing optical based fiber products which comprises:
initially coating said optical fiber products with a layer of carbon or boron carbide; and
further coating said carbon coated fibers with at least one ceramic compound.

13. The method of claim 12 wherein said ceramic compound is a carbide, nitride, boride, oxide, or mixtures thereof.

14. A method for making a hermetically sealed silica based optical fiber product which comprises:
drawing a silica based optical fiber product from a melt or preform;
initially coating said optical fiber product with a layer of carbon or boron carbide; and
further coating said carbon coated fiber product with at least one ceramic compound.

15. The method of claim 14 wherein said ceramic compound is a carbide, nitride, boride, oxide, or mixtures thereof.

16. A method for hermetically sealing silica based optical fiber products which comprises coating said fiber products with a hermetic layer of boron carbide.

17. The method of claim 16 which further comprises initially coating said fiber product with a layer of carbon prior to depositing the layer of boron carbide.

18. The sealed fiber product produced by the method of claim 12.

19. The sealed fiber product produced by the method of claim 17.

20. An optical fiber product having an encapsulating hermetic coating comprising at least one ceramic compound of a transitional metal carbide, nitride or boride, said compound having a density above about 4 g/cc.

21. An optical fiber product of claim 20 wherein the ceramic compound is tungsten carbide, tungsten nitride, tungsten boride, titanium carbide, titanium nitride, titanium boride, chromium nitride, or chromium boride.

22. The optical fiber product of claim 20 wherein the coating comprises two or more of said ceramic compounds which are codeposited as a mixture.

23. The optical fiber product of claim 20 wherein said coating comprises two or more layers of different ceramic compounds.

24. An optical fiber product having an encapsulating hermetic coating comprising a layer of boron carbide.

25. An optical fiber product having an encapsulating hermetic coating comprising a first layer of carbon or boron carbide and a second layer of at least one ceramic compound upon said first layer.

26. The optical fiber product of claim 25 wherein the ceramic compound of the second layer is a carbide, nitride, boride, oxide, or mixtures thereof.

27. An optical fiber product having an encapsulating hermetic coating comprising tungsten oxide, chromium oxide, or mixtures thereof.

28. The product of claim 27 further comprising a layer of carbon between said optical fiber and said hermetic coating.

29. An optical fiber product having an encapsulating hermetic coating comprising a first layer of boron carbide deposited upon said fiber and a second layer of tungsten carbide, tungsten boride, tungsten oxide, titanium carbide, titanium nitride, titanium boride, chromium oxide, chromium nitride, chromium boride, or mixtures there of deposited upon said boron carbide layer.

* * * * *